(12) United States Patent
Bertram

(10) Patent No.: US 7,187,209 B2
(45) Date of Patent: *Mar. 6, 2007

(54) NON-INVERTING DOMINO REGISTER

(75) Inventor: Raymond A. Bertram, Austin, TX (US)

(73) Assignee: VIA Technologies, Inc., Taipei (TW)

( * ) Notice: Subject to any disclaimer, the term of this patent is extended or adjusted under 35 U.S.C. 154(b) by 198 days.

This patent is subject to a terminal disclaimer.

(21) Appl. No.: 11/023,145

(22) Filed: Dec. 27, 2004

(65) Prior Publication Data

US 2005/0127952 A1    Jun. 16, 2005

Related U.S. Application Data

(63) Continuation-in-part of application No. 10/640,369, filed on Aug. 13, 2003.

(60) Provisional application No. 60/553,805, filed on Mar. 17, 2004.

(51) Int. Cl.
*H03K 19/096* (2006.01)
*H03K 19/20* (2006.01)

(52) U.S. Cl. .......................................... 326/95; 326/121

(58) Field of Classification Search .................. 326/83, 326/93, 95, 98, 121; 365/203
See application file for complete search history.

(56) References Cited

U.S. PATENT DOCUMENTS

| | | | |
|---|---|---|---|
| 5,075,386 A | 12/1991 | Vanderbilt | |
| 5,889,979 A | 3/1999 | Miller, Jr. et al. | |
| 5,926,038 A * | 7/1999 | Fouts et al. | 326/95 |
| 6,191,618 B1 | 2/2001 | Gayles et al. | |
| 6,265,899 B1 | 7/2001 | Abdel-Hafeez et al. | |
| 6,496,038 B1 | 12/2002 | Sprague et al. | |
| 6,560,737 B1 | 5/2003 | Colon-Bonet et al. | |
| 6,628,143 B2 | 9/2003 | Hsu et al. | |
| 6,650,145 B2 | 11/2003 | Ngo et al. | |
| 2002/0158670 A1 | 10/2002 | Alvandpour | |
| 2003/0042932 A1 | 3/2003 | Bales | |
| 2003/0052714 A1 | 3/2003 | Alvandpour | |
| 2003/0110404 A1 | 6/2003 | Seningen et al. | |
| 2004/0257115 A1 | 12/2004 | Bertram et al. | |
| 2005/0046446 A1 | 3/2005 | Qureshi et al. | |
| 2005/0110522 A1 | 5/2005 | George | |

* cited by examiner

*Primary Examiner*—Daniel Chang
(74) *Attorney, Agent, or Firm*—Gary R. Stanford; Richard K. Huffman; James W. Huffman

(57) ABSTRACT

A domino register including an evaluation circuit, a write circuit, an inverter, a keeper circuit, and output logic. The evaluation circuit pre-charges a first node and evaluates a logic function for controlling a state of the first node when the clock signal goes high. The write circuit drives a second node high if the first node is low and drives the second node low if the first node stays high during evaluation. The inverter inverts the second node to control the state of a third node. The keeper circuit keeps the second node high while the third node and clock signals are both low and keeps the second node low while the third and first nodes are both high. The high and low paths of the keeper circuit are otherwise disabled, including when the write circuit changes state. Thus, the write circuit does not have to overcome a keeper device.

27 Claims, 5 Drawing Sheets

NON-INVERTING DOMINO REGISTER

CROSS-REFERENCE TO RELATED APPLICATIONS

This application claims the benefit of U.S. Provisional Application Ser. No. 60/553,805, filed on Mar. 17, 2004, which is herein incorporated by reference for all intents and purposes.

This application is a continuation-in-part of the following co-pending U.S. patent application, which has a common assignee and at least one common inventor, and which is herein incorporated by reference in its entirety for all intents and purposes:

| Ser. No. | FILING DATE | TITLE |
| --- | --- | --- |
| 10/640369 | Aug. 13, 2003 | NON-INVERTING DOMINO REGISTER |

BACKGROUND OF THE INVENTION

1. Field of the Invention

The present invention relates to dynamic logic and register functions, and more particularly to a non-inverting domino register that addresses the problem of registering the outputs of complex logic circuits where speed and size are important factors.

2. Description of the Related Art

Integrated circuits use a remarkable number of registers, particularly those having a synchronous pipeline architecture. Register logic is employed to hold the outputs of devices and circuits for a period of time so that these outputs can be received by other devices and circuits. In a clocked system, such as a pipeline microprocessor, registers are used to latch and hold the outputs of a given pipeline stage for a period of one clock cycle so that input circuits in a subsequent stage can receive the outputs during that period while the given pipeline stage is concurrently generating new outputs.

In the past, it has been common practice to precede and follow complex logical evaluation circuits, such as multiple input multiplexers (muxes), multi-bit encoders, etc., with registers to hold the inputs to and the outputs from the evaluation circuits. Generally, these registers have associated setup and hold time requirements, both of which constrain the evaluation circuits in the preceding stage. In addition, registers have corresponding data-to-output time characteristics, which constrain the evaluation circuits in subsequent stages. The "speed" of a register is typically judged in terms of its data-to-output time, that is, the sum of its setup time and clock-to-output time.

Preceding and following a logical evaluation circuit with traditional register circuits introduces delays into a pipeline system whose cumulative effect results in significantly slower operating speeds. More specifically, one notable source of these delays is the data-to-output time requirements that must be satisfied by logical evaluation circuits in order to ensure stable registered outputs. It is desired to reduce these delays to provide additional time in each stage and to thereby increase overall speed of the pipeline system.

A prior and related disclosure, entitled "Non-inverting Domino Register" with Ser. No. 10/640,369, which is incorporated by reference herein, addressed the problems described above. In the prior disclosure, a non-inverting domino register was described which combined logic evaluation functions with their corresponding registers to achieve a faster clock-to-output time than conventional approaches without compromising the stability of its output. The transitions of the output signal of the non-inverting domino register disclosed therein were shown to be very fast in response to transitions of the clock signal in contrast to the slower transition responses of conventional inverting domino registers. The prior non-inverting domino register, however, was not particularly flexible with respect to the evaluation logic, which had to be provided as N-channel logic. Also, the prior non-inverting domino register could potentially experience leakage effects when embodied in a high leakage or high noise process, such as, for example, 90-nanometer (nm) silicon-on-insulator (SOI).

It is desired to provide an improved domino register that provides all of the benefits of the prior non-inverting domino register, and that is further flexible with regard to the domino stage and that is optimum for use in a high leakage or high noise environment.

SUMMARY OF THE INVENTION

A non-inverting domino register according to an embodiment of the present invention includes a domino stage, a write stage, an inverter, high and low keeper paths, and an output stage. The domino stage evaluates a logic function based on at least one input data signal and a clock signal. The domino stage pre-charges a pre-charged node high when the clock signal is low, pulls the pre-charged node low if it evaluates, and keeps the pre-charged node high if it fails to evaluate. The write stage pulls a first preliminary output node high if the pre-charged node goes low, and pulls the first preliminary output node low if the pre-charged node stays high. The inverter inverts the first preliminary output node and provides a second preliminary output node. The high keeper path keeps the first preliminary output node high when enabled and the low keeper path keeps the first preliminary output node low when enabled. The high keeper path is enabled when the clock signal and the second preliminary output node are both low and is otherwise disabled. The low keeper path is enabled when the second preliminary output node and the pre-charged node are both high and is otherwise disabled. The output stage provides an output signal based on states of the pre-charged node and the second preliminary output node.

The non-inverting domino register has a faster clock-to-output time than conventional approaches without compromising the stability of its output. And further, the write stage does not have to overcome either the low or high keeper paths to drive the first preliminary output node to an opposite state. If, for example, the first preliminary output node is high when the clock signal goes high and the domino stage fails to evaluate, then the write stage operates to pull the first preliminary output node low. In this situation, the write stage does not have to overcome the high keeper path to drive the first preliminary output node low since the clock signal is high thereby disabling the high keeper path. In a particular embodiment, the clock signal drives the gate of a P-channel device in the high keeper path, where the P-channel device is turned off when the clock signal is high. And further, the inverter switches the state of the second preliminary output node high in response to switching of the first preliminary output node low to enable the low keeper path to maintain the state of the first and second preliminary output nodes during the remainder of the cycle.

On the other hand, if the first preliminary output node is low when the clock signal goes high and the domino stage evaluates, then the write stage operates to pull the first preliminary output node high. In this situation, the write stage does not have to overcome the low keeper path to drive the first preliminary output node high since the pre-charged node goes low thereby disabling the low keeper path. In a particular embodiment, the pre-charged node drives the gate of an N-channel device in the low keeper path, where the N-channel device is turned off while the pre-charged node is low. And further, the inverter switches the state of the second preliminary output node low in response to switching of the first preliminary output node high. In this case, the pre-charged node is low which keeps the first preliminary output node high while the clock signal is high. The low keeper path is enabled when the clock signal next goes low, which maintains the state of the first and second preliminary output nodes during the remainder of the cycle.

The non-inverting domino register may be implemented in a high leakage environment employing the use of devices which are smaller and faster than those which would otherwise be required to overcome strong keeper devices. For example, the non-inverting domino register may be integrated using a scaled 90 nanometer silicon-on-insulator process or any other scaled process introducing high leakage issues without compromising speed and without requiring large devices.

The domino stage may be implemented with a P-channel device, an N-channel device and evaluation logic. The P-channel device has a gate receiving the clock signal, and a drain and source coupled between a source voltage and the pre-charged node. The N-channel device has a gate receiving the clock signal, a drain coupled to the pre-charged node and a source. The evaluation logic is coupled between ground and the source of the N-channel device. This configuration allows the evaluation logic to be implemented using complementary metal-oxide semiconductor (CMOS) logic.

The write stage may include a P-channel device and first and second N-channel devices. The P-channel device has a gate coupled to the pre-charged node, and a drain and source coupled between a source voltage and the first preliminary output node. The first N-channel device has a gate receiving the clock signal, a drain coupled to the first preliminary output node and a source. The second N-channel device has a gate coupled to the pre-charged node, a drain coupled to the source of the first N-channel device and a source coupled to ground. In one embodiment of this configuration, the high keeper path includes two additional P-channel devices. A second P-channel device has a gate coupled to the second preliminary output node, a source coupled to the source voltage and a drain. A third P-channel device has a gate receiving the clock signal, and a drain and source coupled between the drain of the second P-channel device and the first preliminary output node. In another embodiment of this configuration, the low keeper path includes the second N-channel device and a third N-channel device, where the third N-channel device has a gate coupled to the second preliminary output node, and a drain and source coupled between the first preliminary output node and the drain of the second N-channel device.

A domino register according to an embodiment of the present invention includes an evaluation circuit, a write circuit, an inverter, a keeper circuit, and an output circuit. The evaluation circuit pre-charges a first node while a clock signal is low and evaluates a logic function for controlling a state of the first node when the clock signal goes high. The write circuit drives a second node high if the first node is low and drives the second node low if the first node stays high when the clock signal goes high. The inverter has an input coupled to the second node and an output coupled to a third node. The keeper circuit keeps the second node high while the third node and clock signals are both low and keeps the second node low while the third node and first node are both high. The output circuit provides an output signal based on the states of the first and third nodes.

The evaluation circuit includes a P-channel device, an N-channel device and a logic circuit. The evaluation logic evaluates the logic function based on at least one input data signal. The N- and P-channel devices both receive the clock signal and collectively enable the logic circuit to control the state of the first node when the clock signal goes high. The P-channel device, which is coupled to the first node, pre-charges the first node high while the clock signal is low. In one aspect, the logic circuit is coupled to the first node and the N-channel device is coupled between the logic circuit and ground. In another aspect, the N-channel device is coupled to the first node and the logic circuit is coupled between the N-channel device and ground. In this latter, footless aspect, the logic circuit may be implemented with CMOS devices rather than N-channel devices.

The write circuit may include a P-channel device and first and second N-channel devices. The P-channel device is coupled to the first and second nodes and pulls the second node high if the first node goes low. The first N-channel device is coupled to the second node and receives the clock signal, and the second N-channel device is coupled to the first N-channel device and to the first node. The first and second N-channel devices collectively pull the second node low if the first node stays high when the clock signal goes high. In this case, the keeper circuit may include second and third P-channel devices and a third N-channel device. The second and third P-channel devices are coupled together and to the second and third nodes, and collectively form a high state keeper path which is enabled to pull the second node high when the third node and the clock signal are both low and which is otherwise disabled. The third N-channel device is coupled to the second and third nodes and to the second N-channel device. The second and third N-channel devices collectively form a low state keeper path which is enabled to pull the second node low when the first and third nodes are both high and which is otherwise disabled.

The evaluation circuit, write circuit, inverter, keeper circuit and output circuit may be integrated using a scaled 90 nanometer silicon-on-insulator process as previously described.

A non-inverting domino register according to another aspect of the present invention includes a P-channel device, an N-channel device, evaluation logic, a write stage, a keeper circuit, and an output stage. The P-channel device has a gate receiving a clock signal and a drain and source coupled between a source voltage and a pre-charged node. The N-channel device has a gate receiving the clock signal, a drain coupled to the pre-charged node and a source. The evaluation logic, which evaluates a logic function based on at least one input data signal, is coupled between the source of the N-channel device and ground and is implemented with CMOS logic. The write stage drives a first preliminary output node and includes a first pull-up device and a first pull-down device both responsive to the pre-charged node and a second pull-down device responsive to the clock signal. The keeper circuit has an input coupled to the first preliminary output node and an output that drives a second preliminary output node. The output stage drives an output node and includes a second pull-up device and a third pull-down device both responsive to the pre-charged node and a third pull-up device and a fourth pull-down device both responsive to the second preliminary output node. The evaluation logic, which is embodied in a footless domino register, is embodied in CMOS logic thereby providing significantly better input level noise margin than prior configurations requiring N-channel logic.

A method of registering a logic function and generating a non-inverted output according to an embodiment of the present invention includes pre-charging a first node high while a clock signal is low, evaluating a logic function to control the state of the first node when the clock signal goes high, controlling the state of a second node with the state of the first node when the clock signal goes high, defining the state of a third node as the inverted state of the second node, enabling a low state keeper path to keep the state of the second node low when the first and third nodes are both high and otherwise disabling the low state keeper path, enabling a high state keeper path to keep the state of the second node high when the clock signal and the third node are both low and otherwise disabling the high state keeper path, and determining the state of an output node based on the states of the first and third nodes.

The method may include pulling the first node low when the logic function evaluates and keeping the first node high when the logic function fails to evaluate. The method may include pulling the second node high if the first node is pulled low and pulling the second node low if the first node remains high when the clock signal goes high. The method may include controlling first and second series-coupled pull-down devices with the first and third nodes, respectively. The method may include controlling first and second series-coupled pull-up devices with the clock signal and the third node, respectively. The method may include logically combining the states of the first and third nodes with a NAND function.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for providing registered outputs for logic circuits in which speed, size and stability are critical factors, which is flexible with regard to the evaluation logic, and which may be used in high leakage or high noise environments. He has therefore developed a non-inverting domino register that has a faster data-to-output time without compromising the stability of the output, that is flexible with regard to the evaluation logic implementation, and that may be used in a high leakage or high noise environment, as will be further described below with respect to FIGS. 1–5. When employed in a pipeline architecture that relies heavily on registers to transfer data from stage to stage, a non-inverting domino register according to an embodiment of the present invention enables overall device operating speed to be significantly increased. The overall device may be implemented using faster and smaller devices in a high leakage or high noise process without compromising speed and without requiring large devices to overcome keeper devices.

Figure 1:
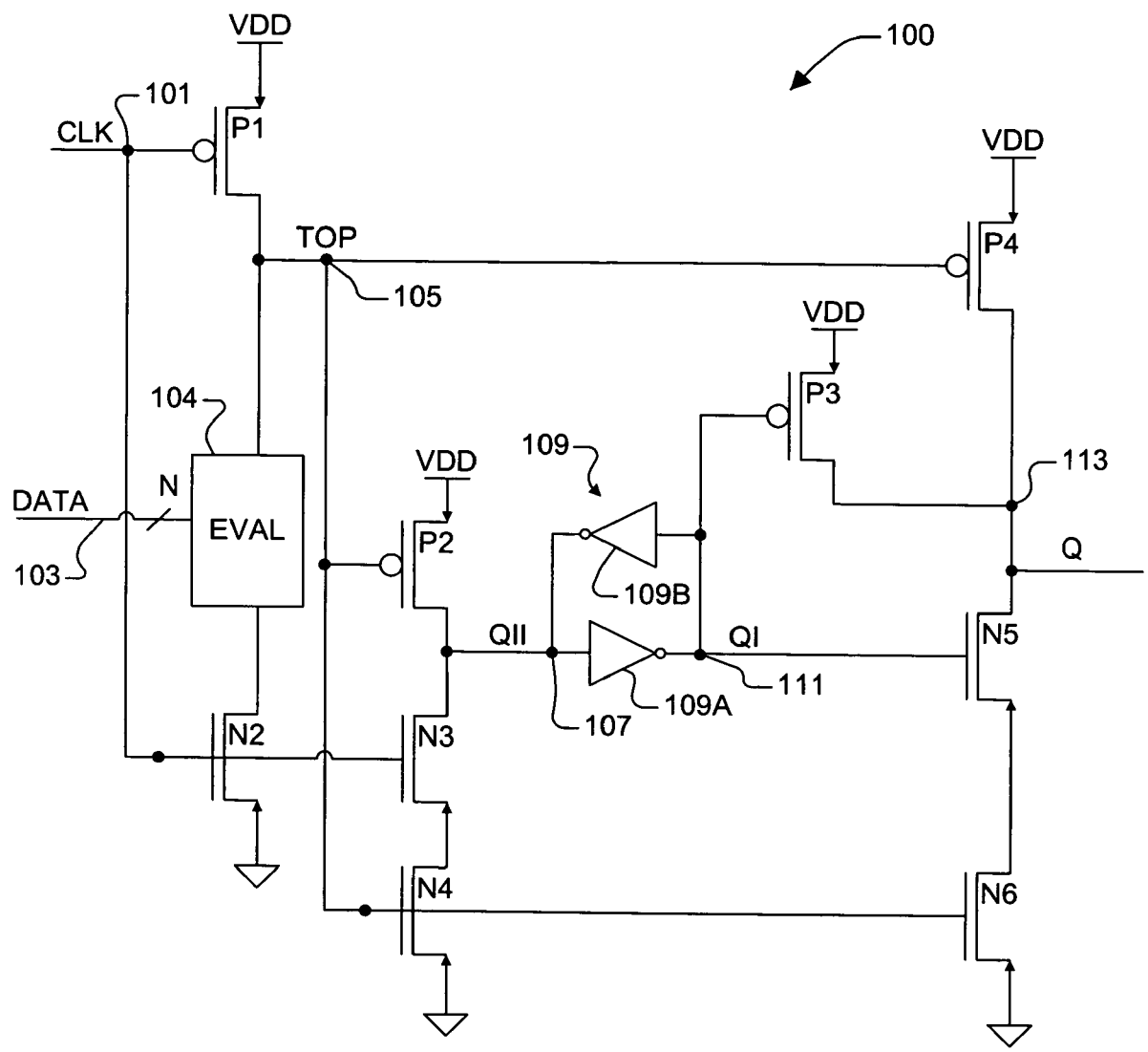
FIG. 1 is a schematic diagram of a non-inverting domino register implemented according to a prior disclosure which is incorporated by reference.

FIG. 1 is a schematic diagram of a non-inverting domino register 100 implemented according to the prior disclosure Ser. No. 10/640,369. The non-inverting domino register 100 includes a logic evaluation input stage, or domino stage, which consists of stacked P-channel and N-channel devices P1 and N2 and evaluation logic 104. The P1 and N2 devices are a complementary pair of evaluation devices coupled on either side of evaluation logic 104 in the stack. The evaluation logic 104 may be as simple as a single N-channel device or may be significantly more complex for evaluation any desired logic function. The source of P1 is coupled to a voltage source VDD and its drain is coupled to node 105 providing a signal TOP. The evaluation logic 104 is coupled between node 105 and the drain of N2, having its source coupled to ground. An input clock signal CLK is provided via node 101 to the gates of P1 and N2. A set of N nodes 103 provide N input data signals DATA to the evaluation logic 104, where N is any positive integer.

The domino stage of the non-inverting domino register 100 is followed by a storage stage which includes devices P2, N3 and N4 and a weak keeper circuit 109. The devices P2, N3 and N4 may be considered as a "write stage" and the keeper circuit 109 as a keeper stage within the storage stage. Node 101 is coupled to the gate of N3 and node 105 is coupled to the gates of P2 and N4. The source of P2 is coupled to VDD and its drain is coupled to a first intermediate output node 107 providing a first intermediate output signal QII. Node 107 is coupled to the drain of N3, to the input of an inverter 109A and to the output of another inverter 109B. The output of the inverter 109A is coupled to a second intermediate output node 111 providing a second intermediate output signal QI, which is coupled to the input of the inverter 109B. The inverters 109A and 109B are cross-coupled between nodes 107 and 111 and collectively form the weak keeper circuit 109. The source of N3 is coupled to the drain of N4, which has its source coupled to ground.

The storage stage of the non-inverting domino register 100 is followed by an additional output stage, which includes P-channel devices P3 and P4 and N-channel devices N5 and N6. Node 105 is coupled to the gates of P4 and N6, and node 111 is coupled to the gates of P3 and N5. The sources of P3 and P4 are coupled to VDD and their drains are coupled together at an output node 113 providing an output signal Q. Output node 113 is coupled to the drain of N5, which has its source coupled to the drain of N6, which has its source coupled to ground. The P-channel devices generally operate as pull-up devices and the N-channel devices generally operate as pull-down devices.

Figure 2:
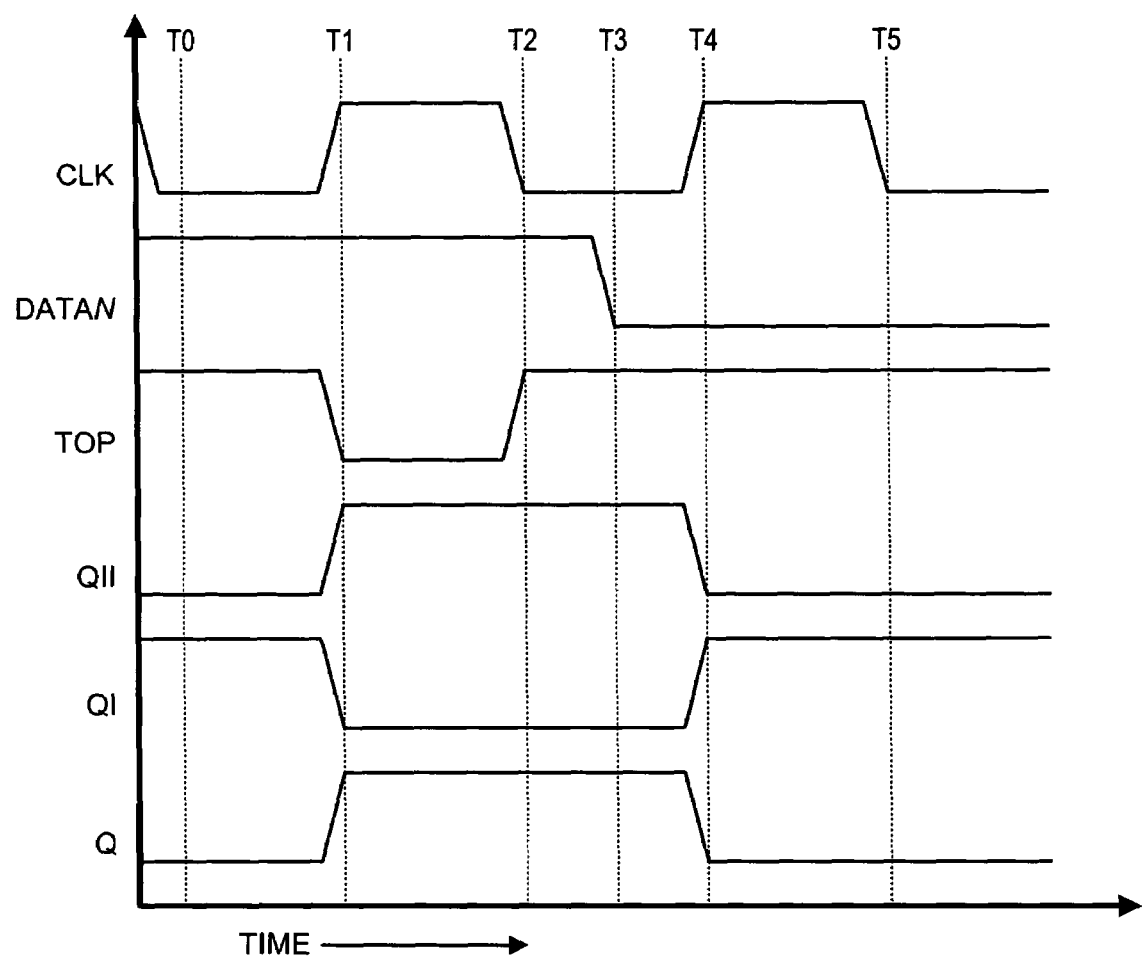
FIG. 2 is a timing diagram illustrating operation of the non-inverting domino register of FIGS. 1, 3, 4 and 5.

FIG. 2 is a timing diagram illustrating operation of the non-inverting domino register 100, in which the CLK, DATAN, TOP, QII, QI and Q signals are plotted versus time. The relative transitions times are estimated and delays are ignored. The DATAN signal is shown as a single signal representing the collective set of N DATA signals. The DATAN signal is shown asserted high for when the collective state of the data signals causes the evaluation logic 104 to evaluate thereby pulling the TOP signal low, and is shown asserted low for when the evaluation logic 104 fails to evaluate, which keeps the TOP signal high. At time T0 when the CLK signal is initially low, N2 is turned off and P1 is turned on, so that the domino stage pre-charges the TOP signal high. The TOP signal is pre-charged high in preparation for evaluation of the DATAN signal by the evaluation logic 104 upon the rising edge of CLK, where the DATAN signal is initially high. The pre-charged TOP signal turns on N4 and N6. The QII signal remains at its former state (shown initially in a low logic state) and is held there by the keeper circuit 109. The QI signal is initially high turning on N5, so that the Q output signal is initially pulled low via the N5 and N6 devices.

At time T1 the CLK signal goes high, which causes the TOP signal to discharge low since the DATAN signal is high. In particular, N2 is turned on and the evaluation logic 104 evaluates pulling TOP low via N2 to ground. The QII signal is pulled high via P2 and the Q output signal is pulled high via P4. The QII and Q signals are both pulled high at about the same time T1, and the QI signal is pulled low by the inverter 109A. The inverted state of the QI signal at the output of the keeper circuit 109 drives the devices P3 and N5. When QI is high, P3 is off and N5 is on; and when QI is low, P3 is on and N5 is off. At subsequent time T2 when the CLK signal next goes low, the TOP signal is once again pre-charged high. P2 and N3 are turned off so that node 107 is not driven to either state. The respective states of the QII and QI signals remain unchanged, however, via operation of the keeper circuit 109, so that the Q and QII signals remain high and the QI signal remains low throughout the remainder of the half cycle of CLK.

The DATAN is shown going low at time T3 while the CLK signal is still low, and the CLK signal is next asserted high at time T4 while the DATAN signal is low. The evaluation logic 104 fails to evaluate, so that TOP remains high while CLK is high. The CLK and TOP signals turn on devices N3 and N4, respectively, so that the QII signal is asserted low at about time T4, and the QI signal is consequently pulled high by the inverter 109A. The TOP signal being high keeps N6 on. The QI signal turns N5 on and P3 off, so that the Q signal is pulled low via N5 and N6. The CLK signal next goes low at time T5 pulling TOP high again. The respective states of the QII and QI signals remain unchanged via operation of the keeper circuit 109. The Q signal remains low throughout the remainder of the cycle of CLK since QI keeps N5 on and TOP keeps N6 on.

The Q signal transitions from low to high relatively quickly in response to a rising edge of the CLK signal when the evaluation logic 104 evaluates discharging the TOP signal low. There is a negligible delay through devices N2 and P4 causing the output transition. The Q signal transitions from high to low after a negligible delay through devices N3, N5 and the inverter 109A in response to a rising edge of the CLK signal when the evaluation logic 104 fails to evaluate leaving the TOP signal high. The delay through the inverter 109A is minimized by being implemented as a relatively small device (with minimal capacitance) since it does not need to have the size nor perform the function of a buffer. It is appreciated by those of ordinary skill in the art that transitions of the output Q signal of the non-inverting domino register 100 are very fast in response to transitions of the CLK signal. If a non-inverting output is necessary or otherwise desired, the non-inverting domino register 100 provides superior data-to-output speed compared to conventional designs among other benefits and advantages. The non-inverting domino register 100 may be converted to an inverting domino register simply by adding an output inverter/buffer (not shown).

The prior disclosure Ser. No. 10/640,369 illustrated exemplary AND logic and OR logic (not shown herein) which may be used as the evaluation logic 104. It was described therein that any suitable combination of the AND and OR logic circuits are contemplated, and that any other complex logical evaluation circuit are contemplated, including, for example, multiple input multiplexers (muxes), multi-bit encoders, etc. Any desired simple to complex evaluation logic can be substituted for the evaluation logic 104 without adversely impacting the speed or associated power constraints of the non-inverting domino register 100. The AND and OR logic circuits were exemplary only and were provided to illustrate that the evaluation logic 104 may be any complex logical evaluation circuit as appreciated by those having ordinary skill in the art. A possible limitation of the inverting domino register 100, however, is that it is not particularly flexible with respect to the evaluation logic 104, which typically had to be implemented as N-channel logic. N-channel logic does not provide the optimal levels of input noise margin.

Figure 3:
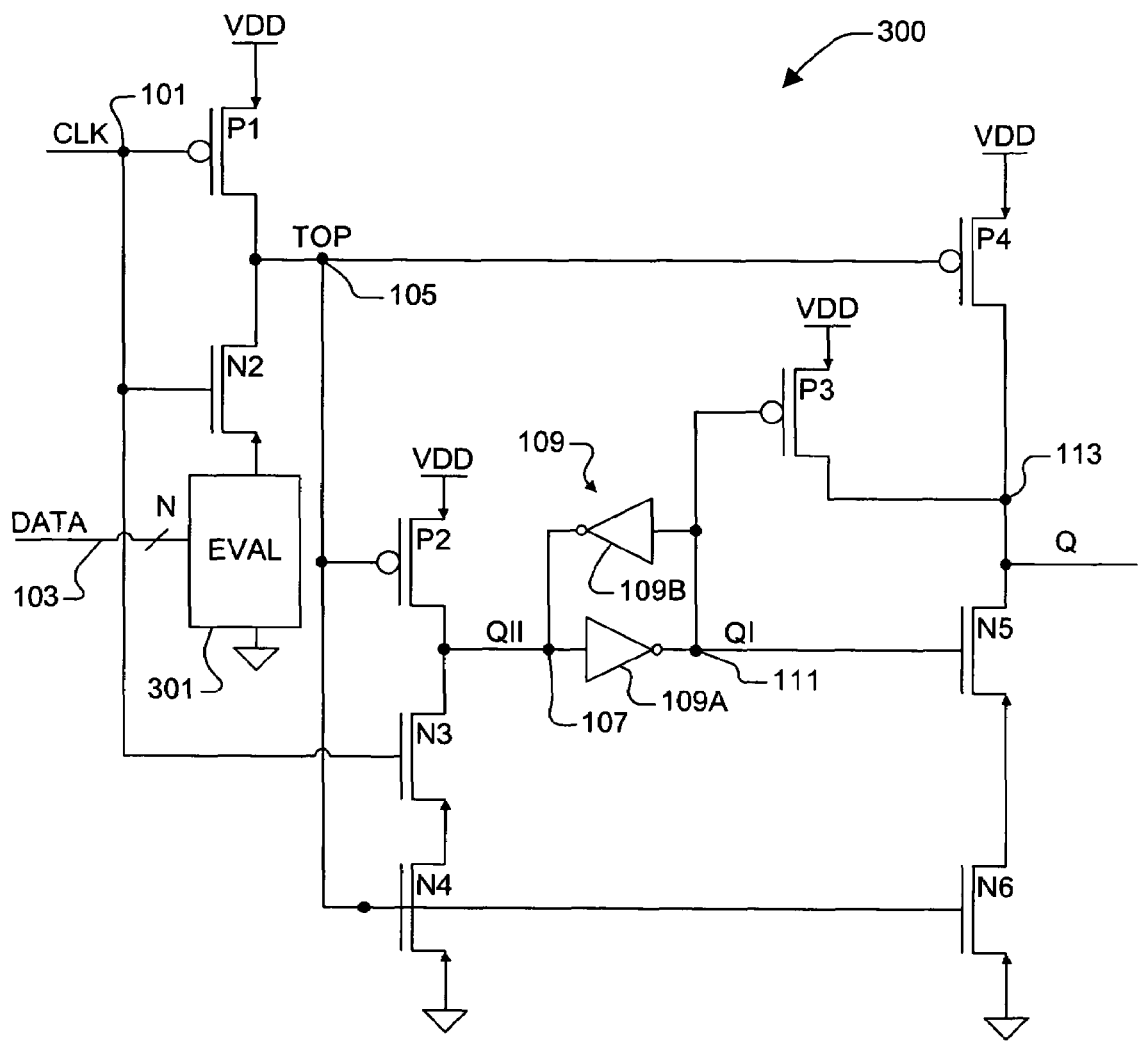
FIG. 3 is a schematic diagram of a footless non-inverting domino register implemented according to an exemplary embodiment of the present invention.

FIG. 3 is a schematic diagram of another non-inverting domino register 300 implemented according to an exemplary embodiment of the present invention. The non-inverting domino register 300 is substantially similar to the non-inverting domino register 100 except that the logic evaluation input stage, or domino stage, comprising the stacked P-channel and N-channel devices P1 and N2 and evaluation logic 104, is reordered into a "footless" configuration and the evaluation logic 104 is replaced with evaluation logic 301. The P1 and N2 devices are a complementary pair of evaluation devices coupled together at the node 105 providing the TOP signal. In this case, the drain of N2 is coupled to node 105 and its source is coupled to the top or upper end of the evaluation logic 301. The lower or bottom end of the evaluation logic 301 is coupled to ground. In this manner, the evaluation logic 301 is located at the foot of the P1/N2 stack as opposed to being coupled between P1 and N2. Operation is substantially similar and the timing diagram of FIG. 2 remains equally valid for the non-inverting domino register 300.

The evaluation logic 301 could be configured in substantially the same manner as the evaluation logic 104. As understood by those skilled in the art, however, the evaluation logic 301 may alternatively be embodied using complementary metal-oxide semiconductor (CMOS) logic rather than N-channel logic, where again, the timing diagram of FIG. 2 remains valid. CMOS logic provides significantly better input level noise margin over N-channel logic so that the non-inverting domino register 300 provides significantly better input level noise margin over the non-inverting domino register 100 when using CMOS logic in the domino stage.

The non-inverting domino registers 100 and 300 both experience leakage effects when embodied in a high leakage or high noise process, such as 90 nm SOI and the like. Scaling circuits down to 90 nm introduces issues related to leakage. Scaled processes exhibit higher leakage because channel lengths are shorter. Consequently, in order to write a new state to node 107 of the storage stage for either of the registers 100 and 300, a weak device must be overcome within the feedback inverter (e.g., within the inverter 109B, a weak P-channel device to change to a low state and a weak N-channel device to change to a high state). The cost of overcoming a device is speed and current. In addition, in processes in which there is either high leakage or high noise, the weak N and P devices within the feedback inverter 109B must be made larger in order to maintain the state of the output node in the presence of leakage or noise.

Note, for example, that the storage node 107 (signal QII) is isolated from the input stage when CLK is low. There is nothing driving the QII signal except the keeper feedback inverter 109B, which includes internal weak N and P devices (not shown). Yet, because of increased leakage associated with a scaled process, a larger amount of leakage current flows through the P2 and N3 devices. So, the N and P devices in the inverter 109B have to be large enough to overcome that leakage. For instance, if the QII signal is high, leakage occurs to ground through the N3 and N4 devices, so that the P device within the inverter 109B has to be large enough to supply enough current to overcome that leakage to keep the QII signal high. In processes in which there is high leakage or high currents and the devices are off, wider and wider devices are needed to hold state. And the use of wider devices substantially reduces performance because when a new state is written, the wider device that is keeping the state must be overcome. To compensate for the reduction in speed, the storage stage devices P2, N3, and N4 are made larger to drive the new state to overcome that held by the large devices in the keeper feedback inverter 109B. Larger devices consume valuable space on an integrated circuit (IC).

Figure 4:
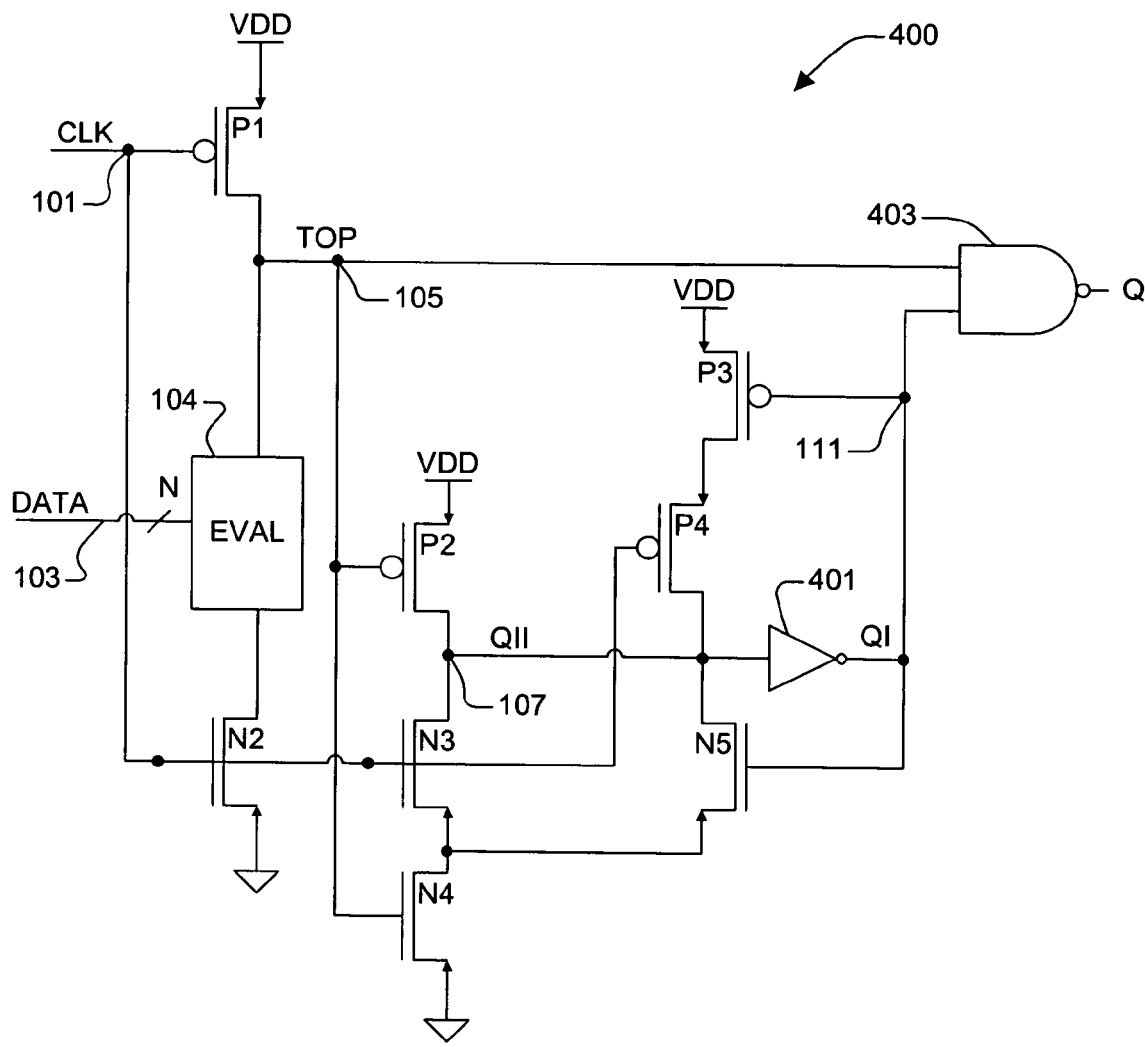
FIG. 4 is a schematic diagram of another non-inverting domino register implemented according to an exemplary embodiment of the present invention employing an improved storage stage.

FIG. 4 is a schematic diagram of another non-inverting domino register 400 implemented according to an exemplary embodiment of the present invention employing an improved keeper circuit. The non-inverting domino register 400 includes an input domino stage followed by a storage stage and an output stage. The domino stage and the initial portion of the storage stage of the register 400 are similar to those of the register 100. The keeper circuit of the register 400, however, is modified to improve performance by eliminating the need to overcome devices and reduce cost in terms of speed and current. The domino stage includes stacked P-channel and N-channel devices P1 and N2 and evaluation logic 104. As before, the P1 and N2 devices are a complementary pair of evaluation devices coupled on either side of evaluation logic 104 between the voltage source VDD and ground. The source of P1 is coupled to VDD and its drain is coupled to node 105 providing the TOP signal. The evaluation logic 104 is coupled between node 105 and the drain of N2 and the source of N2 is coupled to ground. The input clock signal CLK is provided via node 101 to the gates of P1, N2 and N3. A set of N nodes 103 provide N input data signals DATA to the evaluation logic 104. As before, the node 105 providing the TOP signal is coupled to the gates of devices P2 and N4. The initial portion of the storage stage is substantially the same write stage including the stacked devices P2, N3 and N4. The source of P2 is coupled to VDD and its drain is coupled to node 107 developing the first intermediate output signal QII. The drain of N3 is coupled to node 107 and its source is coupled to the drain of N4, having its source coupled to ground.

The storage stage of the non-inverting domino register 400 includes the write stage including devices P3, P4, and N5 and a keeper stage including devices P3, P4, N3 and an inverter 401. The storage stage is followed by an output stage, which comprises a two-input NAND gate 403 in the embodiment illustrated. In this case, the source of P3 is coupled to VDD and its drain is coupled to the source of P4, having its drain coupled to the drain of N5 at the node 107. The source of N5 is coupled to the drain of N4 further coupled to the source of N3. Node 101, providing the CLK signal, is coupled to the gate of P4. Node 107, developing the QII signal, is coupled to the input of the inverter 401, having its output coupled to node 111 developing the second intermediate output signal QI. Node 111 is coupled to the gates of P3 and N5 and is coupled to one input of the NAND gate 403. Node 105, providing the TOP signal, is coupled to the other input of the NAND gate 403, and the output the NAND gate 403 provides the output Q signal.

The timing diagram of FIG. 2 is applicable for the non-inverting domino register 400 for this situation with only minor differences in timing, where such timing differences and small delays are ignored (e.g., delays through the inverter 401 and the NAND gate 403 are ignored). Again, suppose that the QII signal is initially low and is to be asserted high. With reference to FIG. 2, at time T0, the CLK, Q and QII signals are initially low and the QI signal is high. Since CLK is low, P1 is turned on and TOP is pre-charged high turning on N4. Since QI and TOP are both high, the Q signal at the output of the NAND gate 403 is initially low. While CLK is low and QI is high, N5 is on, P3 is off, and P4 is on. In this case, therefore, N5 and N4 are both on providing a "low" state keeper path for the node 107 to ground which keeps the QII signal low. The low keeper path is enabled whenever the second preliminary output node 111 and the pre-charged node 105 are both high, and is otherwise disabled.

When the CLK signal goes high at time T1, N2 is turned on initiating evaluation of the DATA operands by the evaluation logic 104. As before, the DATAN signal, representing the input DATA operands, is shown initially high which causes the evaluation logic 104 to couple node 105 to the drain of N2. This causes the TOP signal to be pulled low via N2. TOP going low causes the NAND gate 403 to assert Q high at about time T1 (after a short delay through the NAND gate 403). Also, TOP going low turns off N4 thereby disabling the low keeper path from N5 through N4 down to ground. And TOP going low turns P2 on so that the QII signal is pulled high at about time T1. When the QII signal goes high at time T1, the inverter 301 pulls the QI signal low, which turns P3 on and N5 off. The Q output signal stays low while the QI signal is low.

In this example, the low keeper path through N5 is disabled because N4 is turned off when the TOP signal goes low. And since N4 is turned off, P2 does not have to overcome N5 to pull the QII signal high. Whenever the QII signal is low and is to be pulled high in response to evaluation (pulling TOP low), the low keeper path is always disabled (because N4 is off) so that the write stage of the storage stage does not have to overcome a keeper device.

At time T2 when CLK next goes low, TOP is once again pre-charged high. Also at time T2, P4 is turned on providing a "high" state keeper path from node 107 to VDD via P4 and P3, thereby keeping the QII signal high. The high keeper path is enabled whenever the pre-charged node 105 and the second preliminary output node 111 are both low, and otherwise disabled. Thus, the QII signal is kept high, which in turn keeps QI low to maintain the state of the Q output signal while TOP goes high at time T2. The TOP signal going high turns N4 back on at about time T2, but since the QI signal is low, N5 is off thereby keeping the low keeper path turned off or disabled for the remainder of the cycle.

The DATAN signal goes low at time T3 and the CLK signal next goes high at time T4 while the DATAN signal is still low so that the evaluation logic 104 does not evaluate. Accordingly, TOP remains high at time T4 so that N4 remains turned on. The CLK signal going high turns P4 off and N3 on. The high keeper path from node 107 to VDD is disabled since P4 is turned off, and N3 and N4 are both on pulling the QII signal low. Since P4 is off, N3 and N4 do not have to overcome any devices, including weak keeper devices, to pull QII low. Whenever the QII signal is high and is to be pulled low in response to failure of evaluation (in which TOP stays high), the high keeper path is always disabled (because P4 is off) so that the write stage of the storage stage does not have to overcome a keeper device. The inverter 401 pulls QI high at about time T4 in response to QII going low. Since QI and TOP are both high, the NAND gate 403 pulls Q low at about time T4. Also, QI going high turns N5 on and P3 off, so that the high keeper path is disabled and the low keeper path via N5 and N4 is re-enabled. When CLK next goes low at time T5, N3 is turned off but QII is kept low through the low keeper path since N5 and N4 are kept on. TOP and QI both remain high, so that Q remains low for the remainder of the CLK cycle.

The non-inverting domino register 400 employs an improved technique to disable the weak keeper feedback devices, so that when a new state is being written, a strong device internal to a keeper device does not have to be overcome. Consequently, the P3 and N5 devices are made wider to overcome leakage in order to maintain state, but without affecting speed because those same devices P3 and N5 are disabled when a new state is written to the storage node 107 (the QII signal). When writing a new state of the QII signal, a feedback keeper circuit does not have to be overcome, so that the devices P2 and N3 can be normal-sized devices. The "keeper" of the non-inverting domino register 400 is only enabled to store the state. In particular, the feedback devices are enabled to keep the state and disabled when writing a new state.

Figure 5:
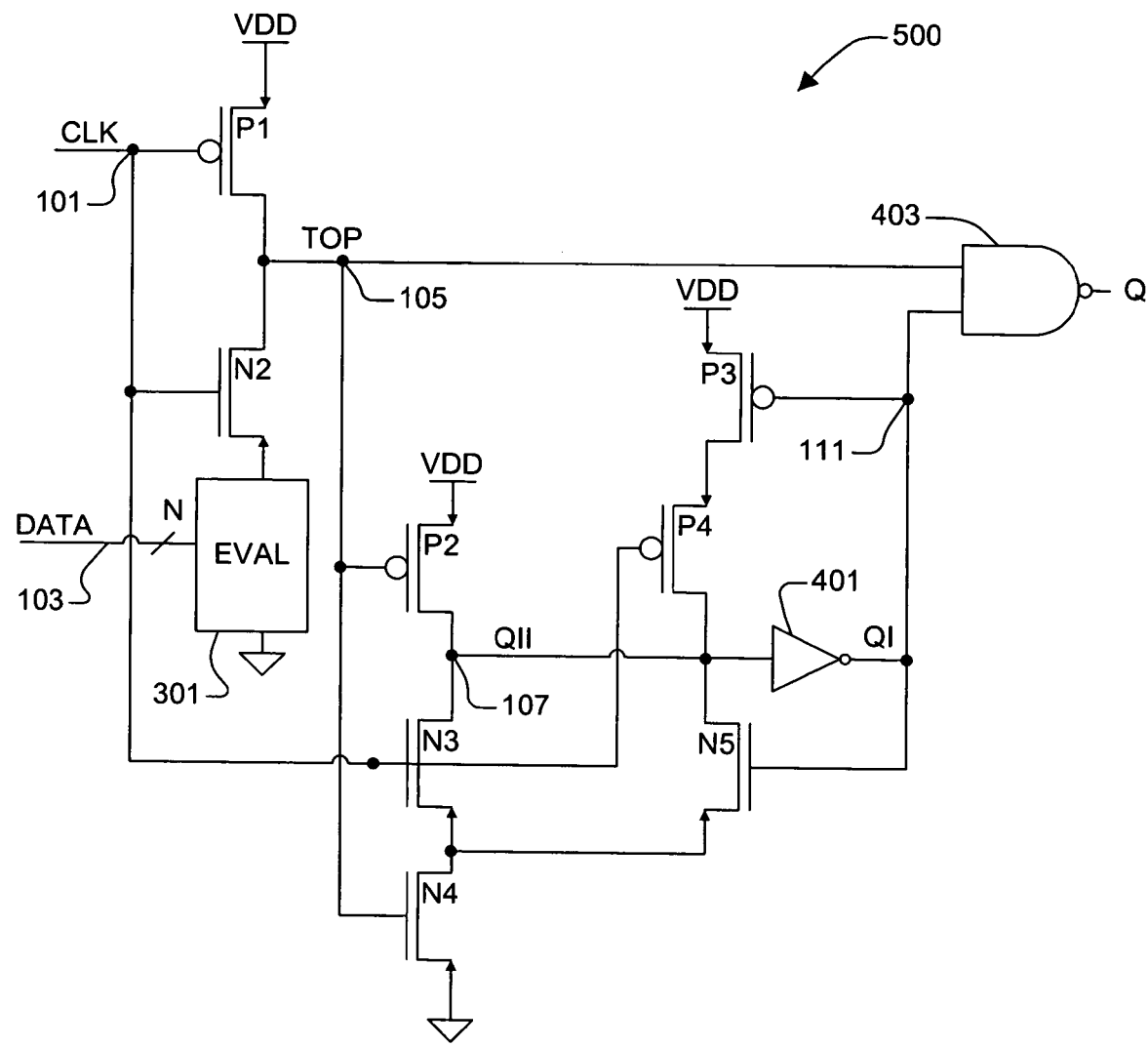
FIG. 5 is a schematic diagram of another footless non-inverting domino register employing the improved storage stage of FIG. 4 and implemented according to an exemplary embodiment of the present invention.

FIG. 5 is a schematic diagram of another footless non-inverting domino register 500 employing the improved keeper stage of the register 400 and implemented according to another exemplary embodiment of the present invention. The non-inverting domino register 500 is substantially similar to the non-inverting domino register 400, except that the logic evaluation input stage, or domino stage, comprising the stacked P-channel and N-channel devices P1 and N2 and evaluation logic 104, is reordered into a "footless" configuration and the evaluation logic 104 is replaced with evaluation logic 301. The change from register 500 from 400 is analogous to the change from register 300 to 100. In this manner, the evaluation logic 301 of the non-inverting domino register 500 may be implemented with CMOS logic rather than N-channel logic, where again, the timing diagram of FIG. 2 remains applicable. As previously described, CMOS logic provides significantly better input level noise margin over N-channel logic so that the non-inverting domino register 500 provides somewhat better input level noise margin over the non-inverting domino register 400 when using CMOS logic in the domino stage.

A non-inverting domino register implemented according to an embodiment of the present invention has a faster clock-to-output time than conventional approaches without compromising the stability of its output, Q. In addition, the storage stage may further be improved to allow for smaller, faster devices to be employed in a high leakage environment than those which would otherwise be required to overcome strong keeper devices. This enables the non-inverting domino register to be embodied in a high leakage or high noise process, such as 90 nm SOI and the like, without causing performance degradation caused by leakage factors. Thus, the benefits of a scaled process, including reduced size, voltage, power consumption, etc., may be attained without causing the performance degradation associated with such scaled processes.

Although the present invention has been described in considerable detail with reference to certain preferred versions thereof, other versions and variations are possible and contemplated. Moreover, although the present disclosure contemplates one implementation using MOS type devices, including CMOS devices and the like, such as, for example, NMOS and PMOS transistors, it may also be applied in a similar manner to different or analogous types of technologies and topologies, such as bipolar devices or the like. Finally, those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. A non-inverting domino register, comprising:
   a domino stage for evaluating a logic function based on at least one input data signal and a clock signal, wherein said domino stage pre-charges a pre-charged node high when said clock signal is low, pulls said pre-charged node low if it evaluates, and keeps said pre-charged node high if it fails to evaluate;
   a write stage, coupled to said domino stage and responsive to said clock signal, which pulls a first preliminary output node high if said pre-charged node goes low and which pulls said first preliminary output node low if said pre-charged node stays high;
   an inverter having an input coupled to said first preliminary output node and an output coupled to a second preliminary output node;
   a high keeper path which keeps said first preliminary output node high when enabled, wherein said higher keeper path is enabled when said clock signal and said second preliminary output node are both low and which is otherwise disabled;
   a low keeper path which keeps said first preliminary output node low when enabled, wherein said low keeper path is enabled when said second preliminary output node and said pre-charged node are both high and which is otherwise disabled; and
   an output stage which provides an output signal based on states of said pre-charged node and said second preliminary output node.

2. The non-inverting domino register of claim 1, wherein said domino stage comprises:
   a P-channel device having a gate receiving said clock signal and a drain and source coupled between a source voltage and said pre-charged node;
   evaluation logic coupled to said pre-charged node; and an N-channel device having a gate receiving said clock signal and a drain and source coupled between said evaluation logic and ground.

3. The non-inverting domino register of claim 1, wherein said domino stage comprises:
- a P-channel device having a gate receiving said clock signal, and a drain and source coupled between a source voltage and said pre-charged node;
- an N-channel device having a gate receiving said clock signal, a drain coupled to said pre-charged node and a source; and
- evaluation logic coupled between ground and said source of said N-channel device.

4. The non-inverting domino register of claim 3, wherein said evaluation logic comprises complementary metal-oxide semiconductor logic.

5. The non-inverting domino register of claim 1, wherein said write stage comprises:
- a first P-channel device having a gate coupled to said pre-charged node, and a drain and source coupled between a source voltage and said first preliminary output node;
- a first N-channel device having a gate receiving said clock signal, a drain coupled to said first preliminary output node and a source; and
- a second N-channel device having a gate coupled to said pre-charged node, a drain coupled to said source of said first N-channel device and a source coupled to ground.

6. The non-inverting domino register of claim 5, wherein said high keeper path comprises:
- a second P-channel device having a gate coupled to said second preliminary output node, a source coupled to said source voltage and a drain; and
- a third P-channel device having a gate receiving said clock signal, and a drain and source coupled between said drain of said second P-channel device and said first preliminary output node.

7. The non-inverting domino register of claim 6, wherein said low keeper path comprises said second N-channel device and a third N-channel device having a gate coupled to said second preliminary output node, and a drain and source coupled between said first preliminary output node and said drain of said second N-channel device.

8. The non-inverting domino register of claim 1, wherein said output stage comprises a NAND gate.

9. The non-inverting domino register of claim 1, wherein said domino stage, said write stage, said inverter, said high and low keeper paths and said output logic are integrated using a scaled 90 nanometer silicon-on-insulator process.

10. A domino register, comprising:
- an evaluation circuit that pre-charges a first node while a clock signal is low and that evaluates a logic function for controlling a state of said first node when said clock signal goes high;
- a write circuit, coupled to said first node and receiving said clock signal, that drives a second node high if said first node is low and that drives the second node low if said first node stays high when said clock signal goes high;
- an inverter having an input coupled to said second node and an output coupled to a third node;
- a keeper circuit, coupled to said second and third nodes and said write circuit, that keeps said second node high while said third node and clock signals are both low and that keeps said second node low while said third node and first node are both high; and
- an output circuit providing an output signal based on states of said first and third nodes.

11. The domino register of claim 10, wherein said evaluation circuit comprises:
- a P-channel device, coupled to said first node and receiving said clock signal, that pre-charges said first node high while said clock signal is low;
- a logic circuit, coupled to said first node, that evaluates said logic function based on at least one input data signal; and
- an N-channel device, coupled between said logic circuit and ground and receiving said clock signal;
- wherein said P-channel device and said N-channel device collectively enable said logic circuit to control said state of said first node when said clock signal goes high.

12. The domino register of claim 10, wherein said evaluation circuit comprises:
- a P-channel device, coupled to said first node and receiving said clock signal, that pre-charges said first node high while said clock signal is low;
- an N-channel device, coupled to said first node and receiving said clock signal; and
- a logic circuit, coupled between said N-channel device and ground, that evaluates said logic function based on at least one input data signal;
- wherein said P-channel device and said N-channel device collectively enable said logic circuit to control said state of said first node when said clock signal goes high.

13. The domino register of claim 12, wherein said logic circuit comprises complementary metal-oxide semiconductor devices.

14. The domino register of claim 10, wherein said write circuit comprises:
- a first P-channel device, coupled to said first and second nodes, that pulls said second node high if said first node goes low;
- a first N-channel device, coupled to said second node and receiving said clock signal; and
- a second N-channel device, coupled to said first N-channel device and to said first node;
- wherein said first and second N-channel devices collectively pull said second node low if said first node remains high in response to said clock signal going high.

15. The domino register of claim 14, wherein said keeper circuit comprises:
- second and third P-channel devices, coupled together and to said second and third nodes, that collectively form a high state keeper path which is enabled to pull said second node high when said third node and said clock signal are both low and which is otherwise disabled; and
- a third N-channel device, coupled to said second and third nodes and to said second N-channel device, wherein said second and third N-channel devices collectively form a low state keeper path which is enabled to pull said second node low when said first and third nodes are both high and which is otherwise disabled.

16. The domino register of claim 10, wherein said output circuit comprises a NAND gate.

17. The domino register of claim 10, wherein said evaluation circuit, said write circuit, said inverter, said keeper circuit and said output logic are integrated using a scaled 90 nanometer silicon-on-insulator process.

18. A non-inverting domino register, comprising:
a first P-channel device having a gate receiving a clock signal and a drain and source coupled between a source voltage and a pre-charged node;
a first N-channel device having a gate receiving said clock signal, a drain coupled to said pre-charged node and a source;
evaluation logic, coupled between said source of said N-channel device and ground and comprising complementary metal-oxide semiconductor logic, that evaluates a logic function based on at least one input data signal;
a write stage driving a first preliminary output node, said write stage comprising a first pull-up device and a first pull-down device both responsive to said pre-charged node, and a second pull-down device responsive to said clock signal;
a keeper circuit having an input coupled to said first preliminary output node and an output that drives a second preliminary output node; and
an output stage driving an output node, said output stage comprising a second pull-up device and a third pull-down device both responsive to said pre-charged node and a third pull-up device and a fourth pull-down device both responsive to said second preliminary output node.

19. The non-inverting domino register of claim 18, wherein said write stage comprises:
a second P-channel device having a gate coupled to said pre-charged node and a drain and source coupled between said source voltage and said first preliminary output node;
a second N-channel device having a gate receiving said clock signal, a drain coupled to said first preliminary output node and a source; and
a third N-channel device having a gate coupled to said pre-charged node, a drain coupled to said source of said second N-channel device and a source coupled to ground.

20. The non-inverting domino register of claim 19, wherein said keeper circuit comprises a pair of inverters cross-coupled between said first and second preliminary output nodes.

21. The non-inverting domino register of claim 18, wherein said output stage comprises:
a second P-channel device having a gate coupled to said pre-charged node and a drain and source coupled between a source voltage and said output node;
a third P-channel device having a gate coupled to said second preliminary output node, a source coupled to said source voltage and a drain coupled to said output node;
a second N-channel device having a gate coupled to said second preliminary output node, a drain coupled to said output node and a source; and
a third N-channel device having a gate coupled to said pre-charged node, a drain coupled to said source of said second N-channel device and a source coupled to ground.

22. A method of registering a logic function and generating a non-inverted output, comprising:
pre-charging a first node high while a clock signal is low;
evaluating a logic function to control the state of the first node when the clock signal goes high;
controlling the state of a second node with the state of the first node when the clock signal goes high;
defining the state of a third node as the inverted state of the second node;
enabling a low state keeper path to keep the state of the second node low when the first and third nodes are both high and otherwise disabling the low state keeper path;
enabling a high state keeper path to keep the state of the second node high when the clock signal and the third node are both low and otherwise disabling the high state keeper path; and
determining the state of an output node based on the states of the first and third nodes.

23. The method of claim 22, wherein said evaluating a logic function to control the state of the first node comprises pulling the first node low when the logic function evaluates and keeping the first node high when the logic function fails to evaluate.

24. The method of claim 23, wherein said controlling the state of a second node with the state of the first node comprises pulling the second node high if the first node is pulled low and pulling the second node low if the first node remains high when the clock signal goes high.

25. The method of claim 22, wherein said enabling a low state keeper path and otherwise disabling the low state keeper path comprises controlling first and second series-coupled pull-down devices with the first and third nodes, respectively.

26. The method of claim 22, wherein said enabling a high state keeper path and otherwise disabling the high state keeper path comprises controlling first and second series-coupled pull-up devices with the clock signal and the third node, respectively.

27. The method of claim 22, wherein said determining the state of an output node comprises logically combining the states of the first and third nodes with a NAND function.

* * * * *